(12) United States Patent
Wang et al.

(10) Patent No.: US 11,289,548 B2
(45) Date of Patent: Mar. 29, 2022

(54) DISPLAY SUBSTRATE, DISPLAY APPARATUS, AND METHOD OF FABRICATING DISPLAY SUBSTRATE

(71) Applicant: BOE Technology Group Co., Ltd., Beijing (CN)

(72) Inventors: Ling Wang, Beijing (CN); Xue Dong, Beijing (CN); Yicheng Lin, Beijing (CN); Cuili Gai, Beijing (CN); Pan Xu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 150 days.

(21) Appl. No.: 16/632,184

(22) PCT Filed: Nov. 20, 2018

(86) PCT No.: PCT/CN2018/116468
§ 371 (c)(1),
(2) Date: Jan. 17, 2020

(87) PCT Pub. No.: WO2020/102985
PCT Pub. Date: May 28, 2020

(65) Prior Publication Data
US 2021/0225962 A1     Jul. 22, 2021

(51) Int. Cl.
*H01L 27/32*        (2006.01)
*H01L 51/52*        (2006.01)
*H01L 51/56*        (2006.01)

(52) U.S. Cl.
CPC ...... *H01L 27/3227* (2013.01); *H01L 27/3218* (2013.01); *H01L 27/3276* (2013.01); *H01L 51/5237* (2013.01); *H01L 51/56* (2013.01); *H01L 2227/323* (2013.01)

(58) Field of Classification Search
CPC ............. H01L 27/3227; H01L 27/3218; H01L 27/3276; H01L 2227/323; H01L 51/5237; H01L 51/56
USPC .......................................................... 257/40
See application file for complete search history.

(56) References Cited

U.S. PATENT DOCUMENTS

| 2017/0032167 | A1* | 2/2017 | Chen .................. H01L 31/09 |
| 2017/0078513 | A1* | 3/2017 | Chang ................ G06F 3/0304 |
| 2018/0225497 | A1* | 8/2018 | Li .................... G06K 9/0008 |
| 2018/0226462 | A1* | 8/2018 | Zhou ................. H01L 27/1259 |
| 2018/0285617 | A1* | 10/2018 | Liu .................... H01L 21/84 |
| 2019/0079628 | A1* | 3/2019 | Liu .................... G06F 3/04144 |

* cited by examiner

*Primary Examiner* — Dzung Tran
(74) *Attorney, Agent, or Firm* — Intellectual Valley Law, P.C.

(57) ABSTRACT

A display substrate includes a base substrate; and a plurality of light emitting brightness value detectors on the base substrate. Each of the plurality of light emitting brightness value detectors includes a first thin film transistor; a protection layer on a side of the first thin film transistor away from the base substrate; and a photosensor electrically connected to the first thin film transistor and configured to detect a light emitting brightness value. An orthographic projection of the protection layer on the base substrate covers an orthographic projection of at least a channel part of the first thin film transistor on the base substrate.

19 Claims, 10 Drawing Sheets

FIG. 8I

DISPLAY SUBSTRATE, DISPLAY APPARATUS, AND METHOD OF FABRICATING DISPLAY SUBSTRATE

CROSS-REFERENCE TO RELATED APPLICATION

This application is a national stage application under 35 U.S.C. § 371 of International Application No. PCT/CN2018/116468, filed Nov. 20, 2018, the contents of which are incorporated by reference in the entirety.

TECHNICAL FIELD

The present invention relates to display technology, more particularly, to a display substrate, a display apparatus, and a method of fabricating a display substrate.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD apparatuses. An OLED display apparatus typically includes an anode, an organic layer including a light emitting layer, and a cathode. OLEDs can be either a bottom-emission type OLED or a top-emission type OLED.

SUMMARY

In one aspect, the present invention provides a display substrate, comprising a base substrate; and a plurality of light emitting brightness value detectors on the base substrate; wherein each of the plurality of light emitting brightness value detectors comprises a first thin film transistor; a protection layer on a side of the first thin film transistor away from the base substrate; and a photosensor electrically connected to the first thin film transistor and configured to detect a light emitting brightness value; wherein an orthographic projection of the protection layer on the base substrate covers an orthographic projection of at least a channel part of the first thin film transistor on the base substrate.

Optionally, the orthographic projection of the protection layer on the base substrate at least partially overlaps with an orthographic projection of a source electrode and a drain electrode of the first thin film transistor on the base substrate.

Optionally, the display substrate further comprises a contact electrode connecting the photosensor and a source electrode of the first thin film transistor; wherein the contact electrode is between the photosensor and the base substrate; and an orthographic projection of the contact electrode on the base substrate covers an orthographic projection of the photosensor on the base substrate.

Optionally, the first thin film transistor comprises a source electrode between the photosensor and the base substrate; and an orthographic projection of the source electrode on the base substrate covers an orthographic projection of the photosensor on the base substrate.

Optionally, the display substrate further comprises a passivation layer between the protection layer and the first thin film transistor; a contact electrode connecting the photosensor and a source electrode of the first thin film transistor; and a first via extending through the passivation layer; wherein the contact electrode is electrically connected to the source electrode of the first thin film transistor through the first via.

Optionally, the protection layer and the contact electrode are in a same layer and comprises a same conductive material; and the protection layer and the contact electrode are spaced apart from each other on the passivation layer.

Optionally, the display substrate further comprises a second via extending through the passivation layer; wherein the protection layer is electrically connected to a gate electrode of the first thin film transistor through the second via.

Optionally, the protection layer is electrically connected to a gate electrode of the first thin film transistor.

Optionally, the display substrate has a plurality of subpixel areas; wherein the plurality of light emitting brightness value detectors are respectively in the plurality of subpixel areas; wherein the display substrate in each of the plurality of subpixel areas further comprises a light emitting element; and a second thin film transistor configured to driving light emission of the light emitting element.

Optionally, the display substrate further comprises a plurality of read lines for respectively transmitting signals detected by the plurality of light emitting brightness value detectors; and a compensation circuit connected to the plurality of read lines, and configured to adjust light emitting brightness values of the plurality of subpixel areas to target brightness values.

Optionally, the display substrate further comprises a common electrode configured to be provided with a common voltage signal; wherein the photosensor comprises a first polarity region connected to the common electrode, a second polarity region connected to a source electrode of the first thin film transistor, and a diode junction connecting the first polarity region and the second polarity region; and the first thin film transistor comprises a source electrode connected to a second polarity region of the photosensor, and a drain electrode connected to a respective one of the plurality of read lines configured to transmit signals detected by the plurality of light emitting brightness value detectors.

Optionally, the protection layer is made of a conductive material.

In another aspect, the present invention provides a display apparatus comprising the display substrate described herein or fabricated by a method described herein.

In another aspect, the present invention provides a method of fabricating a display substrate, comprising forming a plurality of light emitting brightness value detectors on a base substrate; wherein forming each of the plurality of light emitting brightness value detectors comprises forming a first thin film transistor on the base substrate; forming a protection layer on a side of the first thin film transistor away from the base substrate; and subsequent to forming the first thin film transistor and forming the protection layer, forming a photosensor electrically connected to the first thin film transistor and configured to detect a light emitting brightness value; wherein the protection layer and the first thin film transistor are formed so that an orthographic projection of the protection layer on the base substrate covers an orthographic projection of at least a channel part of the first thin film transistor on the base substrate.

Optionally, the method further comprises forming a contact electrode connecting the photosensor and a source electrode of the first thin film transistor; wherein the contact electrode is formed between the photosensor and the base substrate; and the contact electrode and the photosensor are formed so that an orthographic projection of the contact electrode on the base substrate covers an orthographic projection of the photosensor on the base substrate.

Optionally, prior to forming the protection layer and subsequent to forming the first thin film transistor, the method further comprises forming a passivation layer, the passivation layer formed between the protection layer and the first thin film transistor; forming a contact electrode connecting the photosensor and a source electrode of the first thin film transistor; and forming a first via extending through the passivation layer; wherein the contact electrode is formed to be electrically connected to the source electrode of the first thin film transistor through the first via.

Optionally, forming the protection layer and forming the contact electrode comprise forming a conductive material layer on a side of the passivation layer away from the base substrate; and patterning the conductive material layer using a same mask plate, thereby forming the protection layer and the contact electrode in a single patterning step; wherein the protection layer and the contact electrode are formed to be spaced apart from each other on the passivation layer.

Optionally, the method further comprises forming a second via extending through the passivation layer; wherein the protection layer is formed to be electrically connected to a gate electrode of the first thin film transistor through the second via.

Optionally, the method further comprises forming an insulating layer on a side of the photosensor and the protection layer away from the base substrate; wherein subsequent to forming the photosensor and prior to forming the insulating layer, the method is absent of an etching step.

Optionally, forming the photosensor comprising a hydrogen bombardment treatment process.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In an organic light emitting diode display apparatus, light emission intensity is affected by many factors. For example, drifting of the threshold voltage, a shift of driving current, as well as a change in the mobility rate of the thin film transistors, can affect the brightness of the display. The compensation of the light emission in the organic light emitting diode display apparatus can be achieved by either an internal compensation method or an external compensation method. To compensate light emission in the organic light emitting diode display apparatus, a photosensor is disposed in the display apparatus to detect the light emitting brightness value, and a thin film transistor is connected to the photosensor to control the detection of the photo-sensing signal. In fabricating the photosensor, a hydrogen bombardment treatment process is applied. The channel part of the active layer of the thin film transistor will be adversely affected by the hydrogen bombardment treatment, resulting in a negative shift of the threshold voltage of the thin film transistor, an increase in the dark current, and a decrease in the signal noise ratio. The problem is particularly severe when the thin film transistor is a back channel etch-type thin film transistor.

To avoid this problem, in some embodiments, the electrode material layer for forming the source electrode and the drain electrode of the thin film transistor is not patterned (etched) until the photosensor is formed. e.g., after the hydrogen bombardment treatment process is performed. However, patterning thus etching the electrode material layer for forming the source electrode and the drain electrode subsequent to forming the photosensor inevitably leads to another issue, i.e., the etching of the electrode material layer would inadvertently damage a lateral side of the photosensor, which is proximal to the source electrode and the drain electrode to be formed. This adversely affects the performance of the photosensor, resulting in an increase in the dark current of the photosensor and a decrease in the signal noise ratio.

Accordingly, the present disclosure provides, inter alia, a display substrate, a display apparatus, and a method of fabricating a display substrate that substantially obviate one or more of the problems due to limitations and disadvantages of the related art. In one aspect, the present disclosure provides a display substrate. In some embodiments, the display substrate includes a base substrate; and a plurality of light emitting brightness value detectors on the base substrate. Optionally, each of the plurality of light emitting brightness value detectors includes a first thin film transistor; a protection layer on a side of the first thin film transistor away from the base substrate; and a photosensor electrically connected to the first thin film transistor and configured to detect a light emitting brightness value. Optionally, an orthographic projection of the protection layer on the base substrate covers an orthographic projection of at least a channel part of the first thin film transistor on the base substrate. Optionally, the orthographic projection of the protection layer on the base substrate covers an orthographic projection of at least a gate electrode of the first thin film transistor on the base substrate. Optionally, the orthographic projection of the protection layer on the base substrate at least partially overlaps with an orthographic projection of a source electrode and a drain electrode of the first thin film transistor on the base substrate. Optionally, the display substrate is an array substrate having an array of a plurality of thin film transistors for driving light emission of the display substrate. Optionally, the display substrate is a counter substrate.

Figure 1:
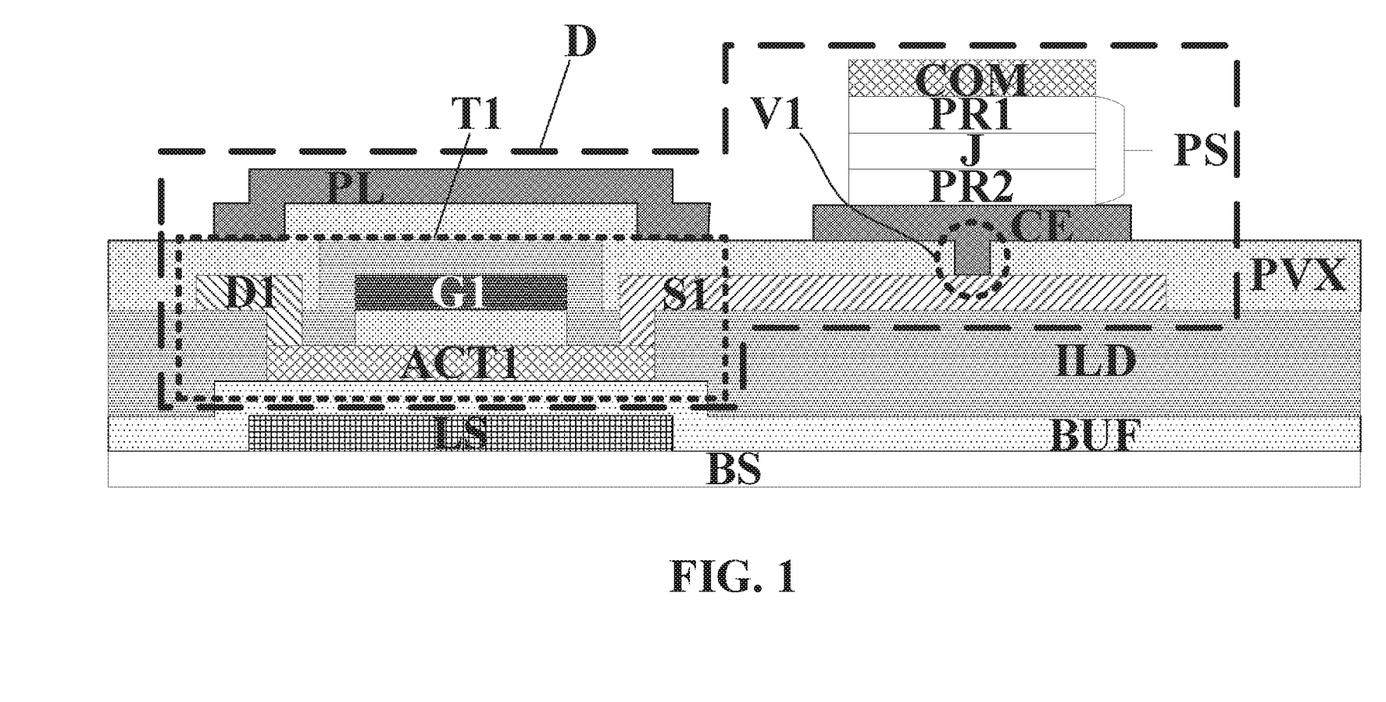
FIG. 1 is a schematic diagram illustrating the partial structure of a display substrate in some embodiments according to the present disclosure.

FIG. 1 is a schematic diagram illustrating the partial structure of a display substrate in some embodiments according to the present disclosure. Referring to FIG. 1, the display substrate in some embodiments includes a base substrate BS and plurality of light emitting brightness value detectors D on the base substrate BS. Each of the plurality of light emitting brightness value detectors D includes a first thin film transistor T; a protection layer PL on a side of the first thin film transistor T1 away from the base substrate BS; and a photosensor PS electrically connected to the first thin film transistor T1 and configured to detect a light emitting brightness value. The first thin film transistor T1 includes a first active layer ACT1, a first gate electrode G1, a first source electrode S1, and a first drain electrode D1. The photosensor PS includes a first polarity region PR1 connected to a common electrode COM, a second polarity region PR2 connected to a first source electrode S1 of the first thin film transistors T1, and a diode junction J connecting the first polarity region PR1 and the second polarity region PR2. As used herein, the term diode junction refers to a junction that can exhibit current rectification, e.g., a junction that exhibits drastically different conductivities in one bias direction relative to the other.

In some embodiments, an orthographic projection of the protection layer PL on the base substrate BS covers an orthographic projection of at least a channel part of the first thin film transistor T1 on the base substrate BS. Optionally, the orthographic projection of the protection layer PL on the base substrate BS covers an orthographic projection of the first gate electrode G1 of the first thin film transistor T1 on the base substrate BS. Optionally, the orthographic projection of the protection layer PL on the base substrate BS at least partially overlaps with an orthographic projection of the first source electrode S1 and the first drain electrode D1 of the first thin film transistor T1 on the base substrate BS.

The display substrate in FIG. 1 further includes a light shielding layer LS between the first active layer ACT1 and the base substrate BS, and configured to shield light from irradiating on the first active layer ACT1. An orthographic projection of the light shielding layer LS on the base substrate BS covers an orthographic projection of at least a channel part of the first thin film transistor T1 on the base substrate BS. Optionally, the orthographic projection of the light shielding layer LS on the base substrate BS covers an orthographic projection of the first gate electrode G1 of the first thin film transistor T1 on the base substrate BS. Optionally, the orthographic projection of the light shielding layer LS on the base substrate BS at least partially overlaps with an orthographic projection of the first source electrode S1 and the first drain electrode D1 of the first thin film transistor T1 on the base substrate BS.

Referring to FIG. 1, the display substrate in some embodiments further includes a buffer layer BUF on a side of the light shielding layer LS away from the base substrate BS, an inter-layer dielectric layer ILD on a side of the first gate electrode G1 of the first thin film transistor T1 away from the buffer layer BUF, a passivation layer PVX on a side of the first source electrode S1, the first drain electrode D1, and the inter-layer dielectric layer ILD away from the base substrate BS. Optionally, the protection layer PL is on a side of the passivation layer PVX away from the base substrate BS.

In some embodiments, the display substrate further includes a contact electrode CE, the second polarity region PR2 is electrically connected to the first source electrode S1 of the first thin film transistors T1 through the contact electrode CE. Optionally, the contact electrode CE is between the photosensor PS and the base substrate BS, e.g., between the second polarity region PR2 of the photosensor PS and the passivation layer PVX. Optionally, the display substrate includes a first via V extending through the passivation layer PVX, and the contact electrode CE is electrically connected to the first source electrode S1 through the first via V1. Optionally, an orthographic projection of the contact electrode CE on the base substrate BS covers an orthographic projection of the photosensor PS on the base substrate BS.

Referring to FIG. 1, the first source electrode S1 is between the photosensor PS and the base substrate BS. The first source electrode S1 in FIG. 1 has an enlarged area, and extends into a region underneath the photosensor PS. Optionally, an orthographic projection of the first source electrode S1 on the base substrate BS covers an orthographic projection of the photosensor PS on the base substrate BS. The first source electrode S1 further shield ambient light (from the outside of the base substrate BS) from irradiating on the photosensor PS. In this way, the photosensor PS is configured to accurately detect an actual light emitting brightness value from a light emitting element of the display substrate, substantially free of interference from the ambient light, thereby enhancing the accuracy of the detection of the light emitting brightness.

Referring to FIG. 1 again, in some embodiments, a combination of the orthographic projection of the protection layer PL and the orthographic projection of the first source electrode S1 on the base substrate BS substantially covers an orthographic projection of the first active layer ACT1 on the base substrate BS. During the process of forming the photosensor, a hydrogen bombardment treatment is performed. The protection layer PL effectively protects the channel part of the first active layer ACT1 from the hydrogen bombardment treatment, avoiding adverse effects on the performance of the thin film transistor, e.g., a negative shift of the threshold voltage. A combination of the protection layer PL and the first source electrode S1 effectively protects the entire active layer from the hydrogen bombardment treatment. Optionally, a combination of the protection layer PL and the contact electrode CE protects the entire active layer from the hydrogen bombardment treatment except for the gap between the protection layer PL and the contact electrode CE. Optionally, the protection layer PL alone is sufficient to protect the first active layer ACT1 from the hydrogen bombardment treatment, e.g., the orthographic projection of the protection layer PL on the base substrate BS substantially covers the orthographic projection of the first active layer ACT1 on the base substrate BS.

Referring to FIG. 1, in some embodiments, the passivation layer PVX is between the protection layer PL and the first thin film transistor T1. The protection layer PL and the contact electrode CE are on a side of the passivation layer PVX away from the base substrate BS. The display substrate further includes a first via V1 extending through the passivation layer PVX, and the contact electrode CE is electrically connected to the first source electrode S1 through the first via V1. Optionally, the protection layer PL and the contact electrode CE are in a same layer and include a same conductive material. The protection layer PL and the contact electrode CE are spaced apart from each other on the passivation layer PVX. As used herein, the term "same layer" refers to the relationship between the layers simultaneously formed in the same step. In one example, the protection layer PL and the contact electrode CE are in a same layer when they are formed as a result of one or more steps of a same patterning process performed in a same layer of material. In another example, the protection layer PL and the contact electrode CE can be formed in a same layer by simultaneously performing the step of forming the protection layer PL and the step of forming the contact electrode CE. The term "same layer" does not always mean that the thickness of the layer or the height of the layer in a cross-sectional view is the same. By forming the protection layer PL and the contact electrode CE in a same layer in a single patterning step, the fabrication process can be made much simplified.

Figure 2:
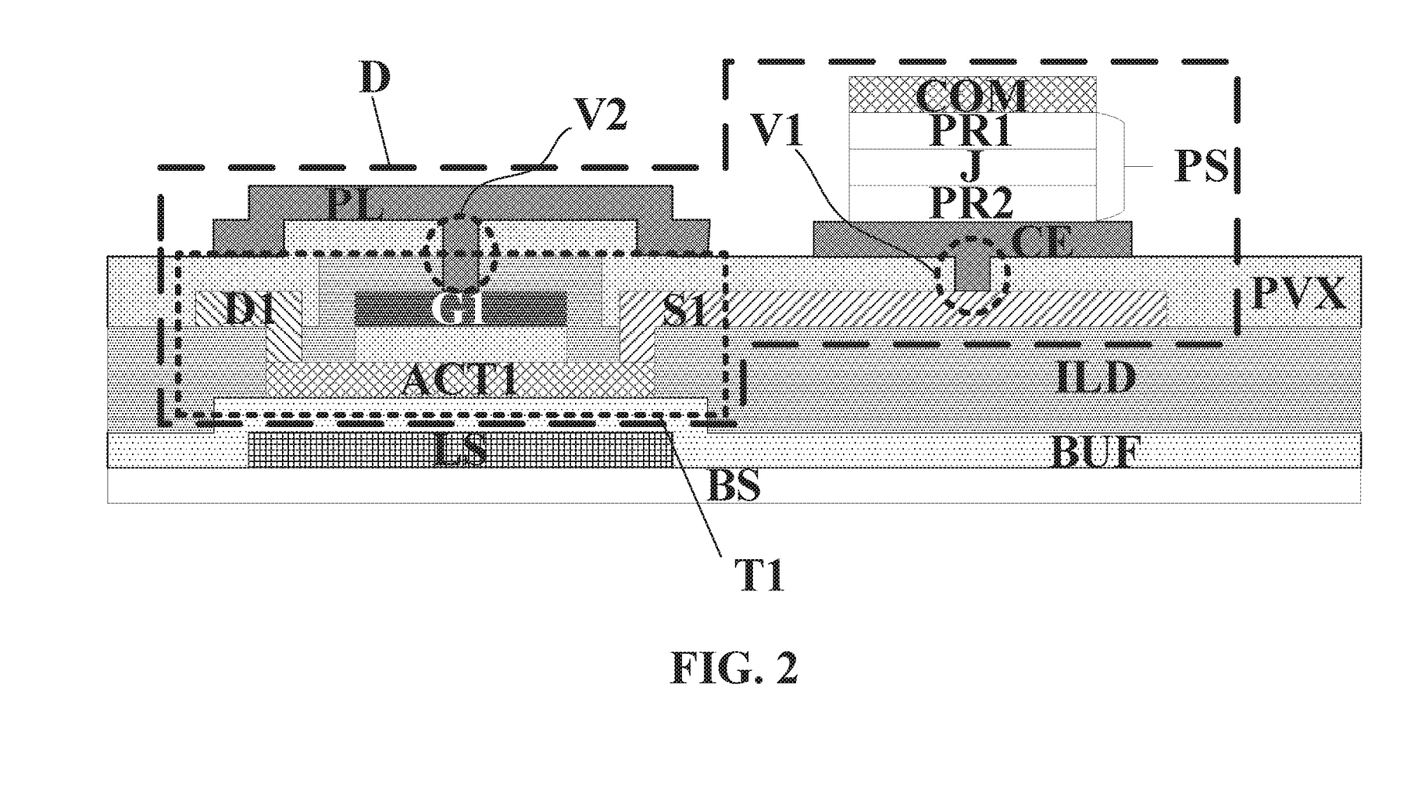
FIG. 2 is a schematic diagram illustrating the partial structure of a display substrate in some embodiments according to the present disclosure.

FIG. 2 is a schematic diagram illustrating the partial structure of a display substrate in some embodiments according to the present disclosure. Referring to FIG. 2, the display substrate in some embodiments further includes a second via V2 extending through the passivation layer PVX. The protection layer PL is electrically connected to the first gate electrode G1 of the first thin film transistor T1 through the second via V2. By having this design, any effects of the parasitic capacitance induced by the protection layer PL on the photo-sensing signal detected by the photosensor PS can be reduced to a negligible level. Optionally, the display substrate further includes an inter-layer dielectric layer ILD between the first gate electrode G1 and the protection layer PL, and the second via V2 extends through the passivation layer PVX and the inter-layer dielectric layer ILD.

Figure 3:
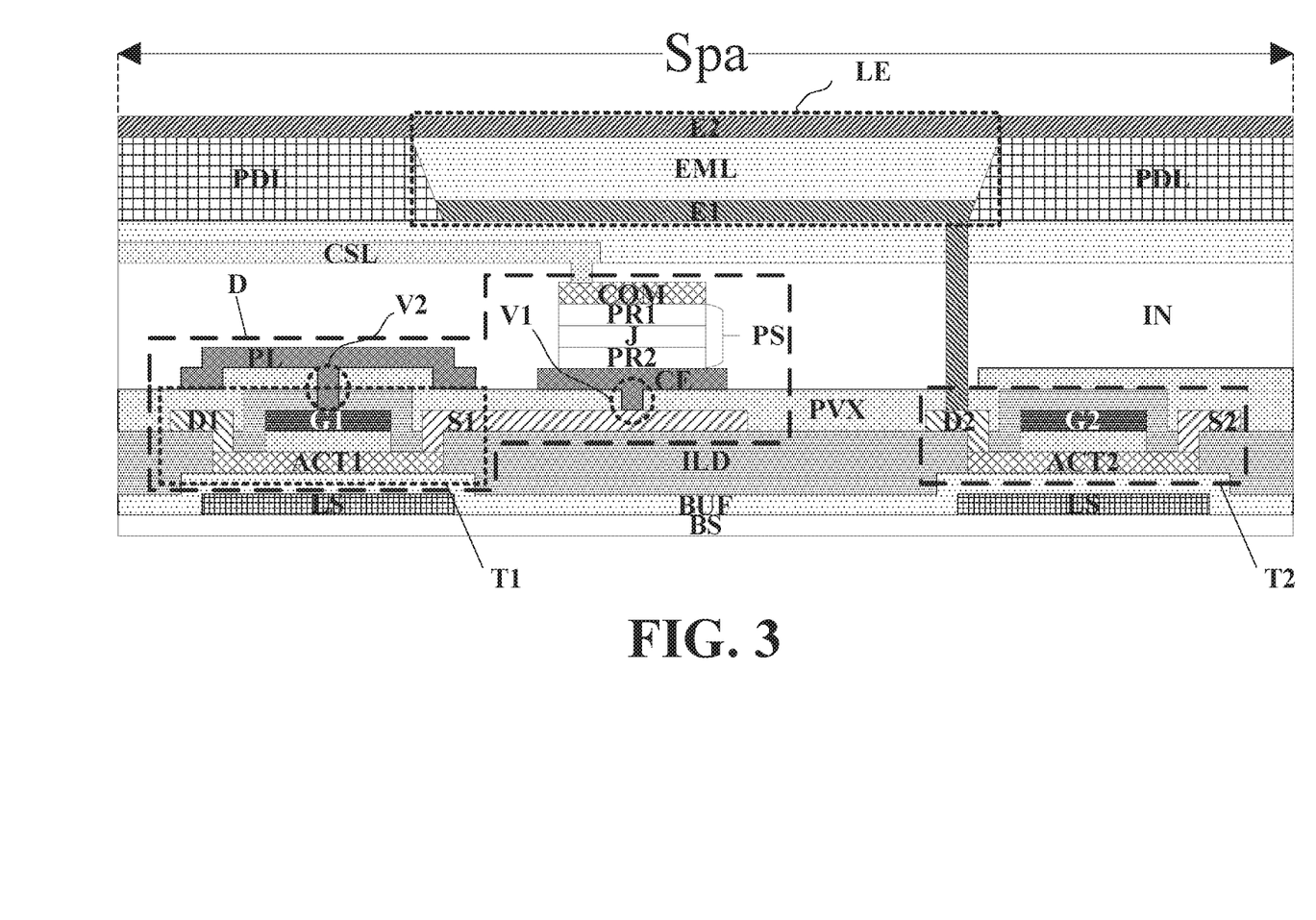
FIG. 3 is a schematic diagram illustrating the partial structure of a display substrate in some embodiments according to the present disclosure.

FIG. 3 is a schematic diagram illustrating the partial structure of a display substrate in some embodiments according to the present disclosure. Referring to FIG. 3, the display substrate in some embodiments includes a plurality of subpixel areas Spa. The plurality of light emitting brightness value detectors D are respectively in the plurality of subpixel areas Spa. The display substrate in each of the plurality of subpixel areas further includes a light emitting element LE (e.g., an organic light emitting diode), and a second thin film transistor T2 configured to driving light emission of the light emitting element.

Various appropriate light emitting elements may be used in the present display substrate. Examples of appropriate light emitting elements include an organic light emitting diode, a quantum dots light emitting diode, and a micro light emitting diode.

The second thin film transistor T2 includes a second active layer ACT2, a second gate electrode G2, a second source electrode S2, and a second drain electrode D2. The light emitting element LE includes a first electrode E1, a light emitting layer EML, and a second electrode E2, the light emitting layer EML between the first electrode E1 and the second electrode E2. The second drain electrode D2 of the second thin film transistor T2 is electrically connected to the first electrode E1 for providing a driving voltage to the first electrode E1. The display substrate further includes a pixel definition layer PDL for defining a pixel aperture. The light emitting layer EML is disposed within the pixel aperture.

Further, the light shielding layer LS in some embodiments is between the second active layer ACT2 and the base substrate BS, and configured to shield light from irradiating on the second active layer ACT2. An orthographic projection of the light shielding layer LS on the base substrate BS covers an orthographic projection of at least a channel part of the second thin film transistor T2 on the base substrate BS. Optionally, the orthographic projection of the light shielding layer LS on the base substrate BS covers an orthographic projection of the second gate electrode G2 of the second thin film transistor T2 on the base substrate BS.

Optionally, the orthographic projection of the light shielding layer LS on the base substrate BS at least partially overlaps with an orthographic projection of the second source electrode S2 and the second drain electrode D2 of the second thin film transistor T2 on the base substrate BS.

The source electrodes and drain electrodes of the thin film transistors in some embodiments are in a same layer. For example, the first source electrode S1, the first drain electrode D1, the second source electrode S2, and the second drain electrode D2 are in a same layer and made of a same conductive material. In some embodiments, the first gate electrode G1 and the second gate electrode G2 are in a same layer and made of a same conductive material. In some embodiments, the first active layer ACT1 and the second active layer ACT2 are in a same layer and made of a same semiconductor material. In some embodiments, the first thin film transistor T1 and the second thin film transistor T2 are top gate thin film transistors (as shown in FIG. 3). In some embodiments, the first thin film transistor T1 and the second thin film transistor T2 are bottom gate thin film transistors.

The display substrate in some embodiments further includes a common electrode COM configured to be provided with a common voltage signal. Referring to FIG. 3, the display substrate in some embodiments further includes a common electrode signal line CSL for providing the common voltage signal to the common electrode COM. The common electrode COM is electrically connected to the first polarity region PR1 of the photosensor PS. Optionally, the display substrate further includes an insulating layer IN on a side of the photosensor PS and the protection layer PL away from the base substrate BS.

Figure 4:
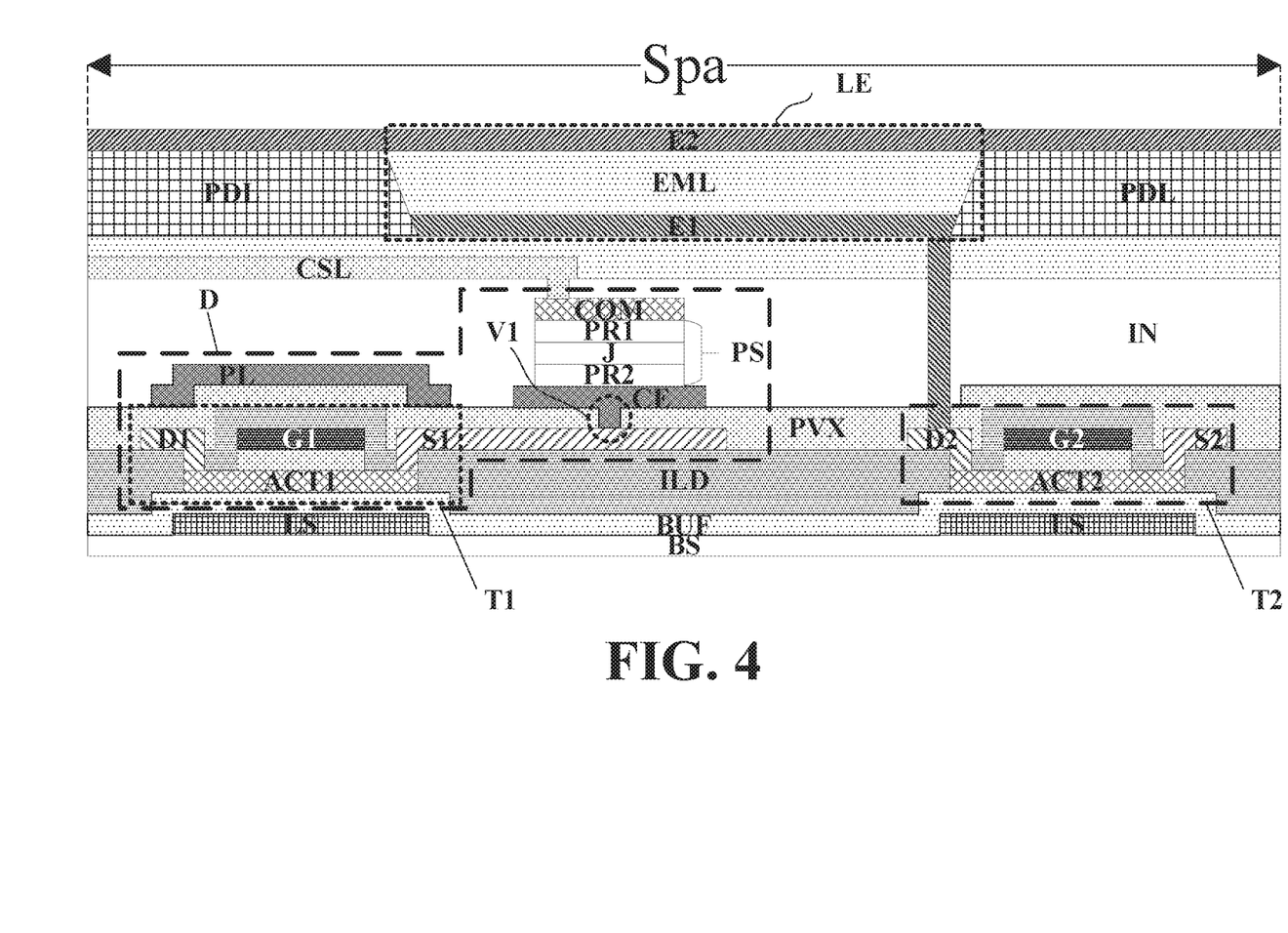
FIG. 4 is a schematic diagram illustrating the partial structure of a display substrate in some embodiments according to the present disclosure.

FIG. 4 is a schematic diagram illustrating the partial structure of a display substrate in some embodiments according to the present disclosure. The structure of the display substrate in FIG. 4 is largely similar to the structure of the display substrate in FIG. 3. In FIG. 4, the protection layer PL is a floating layer, e.g., not electrically connected to the first gate electrode G1 of the first thin film transistor T1.

Figure 5:
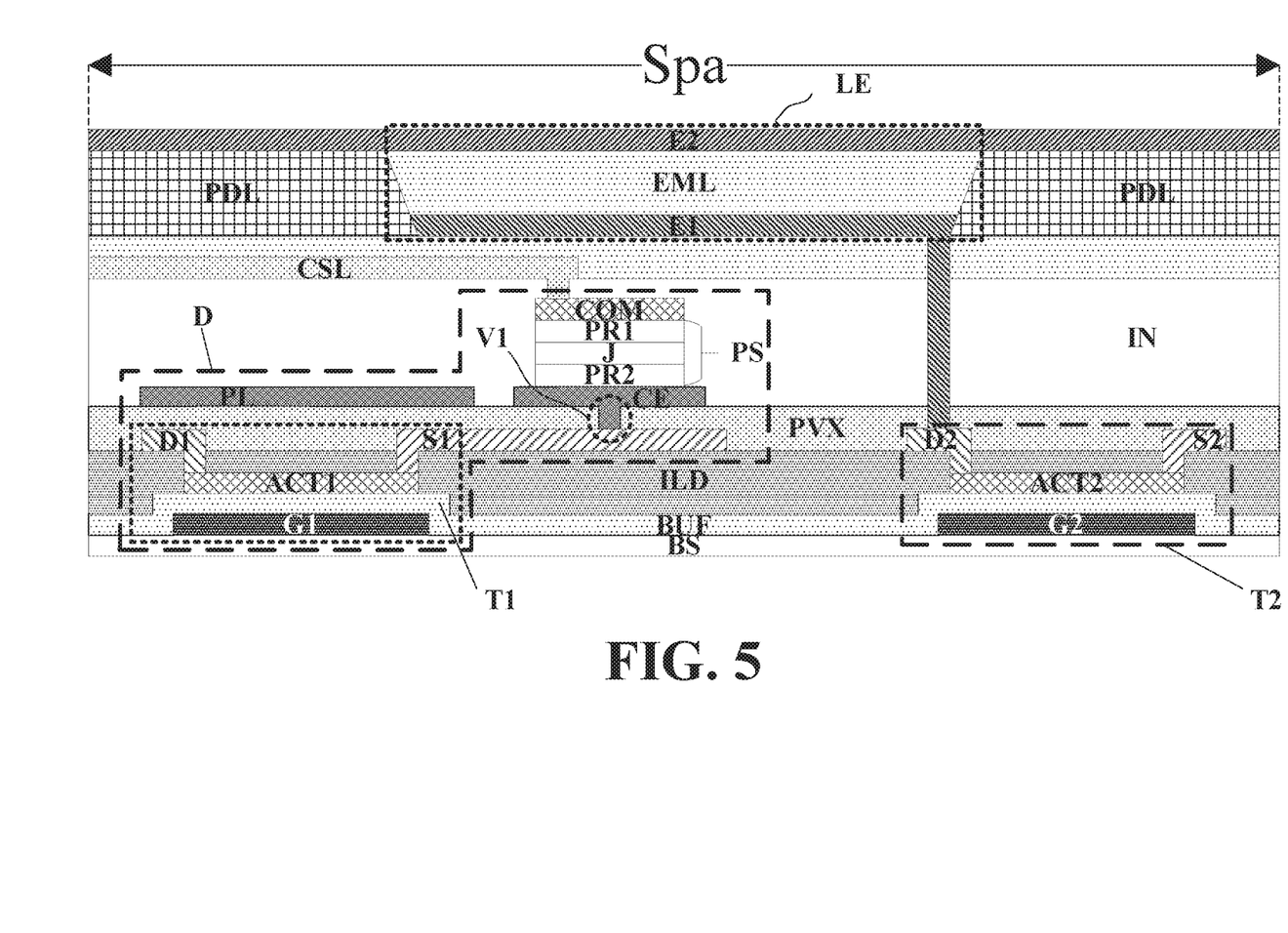
FIG. 5 is a schematic diagram illustrating the partial structure of a display substrate in some embodiments according to the present disclosure.

FIG. 5 is a schematic diagram illustrating the partial structure of a display substrate in some embodiments according to the present disclosure. The structure of the display substrate in FIG. 5 is largely similar to the structure of the display substrate in FIG. 4. The first thin film transistor T1 and the second thin film transistor T2 in FIG. 5 are bottom gate thin film transistors, and the protection layer PL is a floating layer not connected to other electrodes of the display substrate.

Figure 6:
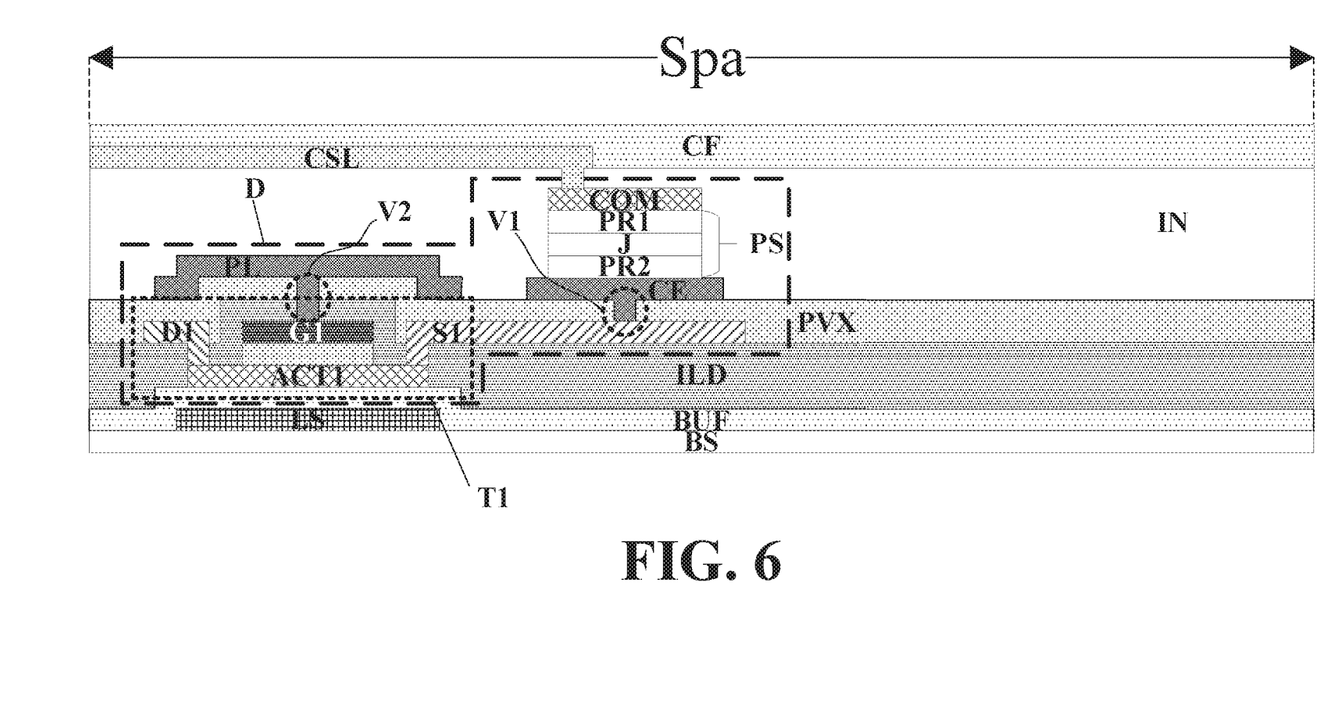
FIG. 6 is a schematic diagram illustrating the partial structure of a display substrate in some embodiments according to the present disclosure.

FIG. 6 is a schematic diagram illustrating the partial structure of a display substrate in some embodiments according to the present disclosure. Referring to FIG. 6, the display substrate in some embodiments is a counter substrate. For example, the counter substrate in a display panel faces the array substrate to form a cell. In some embodiments, the counter substrate is a color filter substrate including a color filter CF. By having the plurality of light emitting brightness value detectors D in the counter substrate, particularly by having the plurality of light emitting brightness value detectors D between the base substrate BS and the color filter CF, the brightness value of the light sensed by the photosensor PS can be a good representative of the actual light emitting brightness value.

Figure 7A:
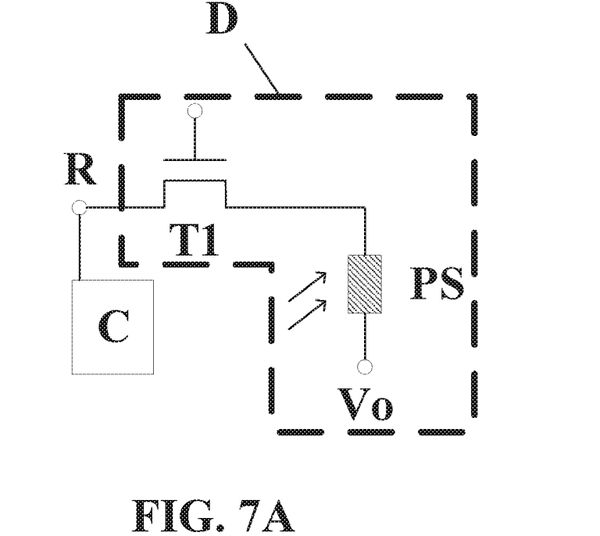
FIG. 7A is a circuit diagram of a light emitting brightness value detector in some embodiments according to the present disclosure.

FIG. 7A is a circuit diagram of a light emitting brightness value detector in some embodiments according to the present disclosure. Referring to FIG. 7A and FIG. 1, the light emitting brightness value detectors D includes the first thin film transistor T1 and the photosensor PS electrically connected to each other. The first source electrode S1 of the first thin film transistor T1 is electrically connected to the photosensor PS. The first drain electrode D1 of the first thin film transistors T1 is electrically connected to one of a plurality of read line R, which in turn is connected to a compensation circuit C. The plurality of read lines R are configured to respectively transmit signals detected by the plurality of light emitting brightness value detectors D to the compensation circuit C. The compensation circuit C is electrically connected to the plurality of read lines R, and is configured to adjust light emitting brightness values of the plurality of subpixel areas Spa to the target brightness values. Vo in FIG. 7A stands for a common voltage provided to the common electrode, and in turn to the first polarity region PR1 of the photosensor PS. Referring to FIG. 7A and FIG. 1, the first drain electrode D1 of the first thin film transistor T1 is electrically connected to a respective one of the plurality of read lines R. When the first thin film transistor T1 is turned on, a photo-sensing signal is transmitted from the first source electrode S1 to the first drain electrode D1, and in turn to the respective one of the plurality of read lines R.

Various appropriate photosensors having a diode junction may be utilized in making and using the present display panel. Examples of photosensors having a diode junction include, but are not limited to, a PN photodiode, a PIN photodiode, an avalanche photodiode, a MIM diode junction, a MIS diode junction, a MOS diode junction, a SIS diode junction, and a MS diode junction.

Figure 7B:
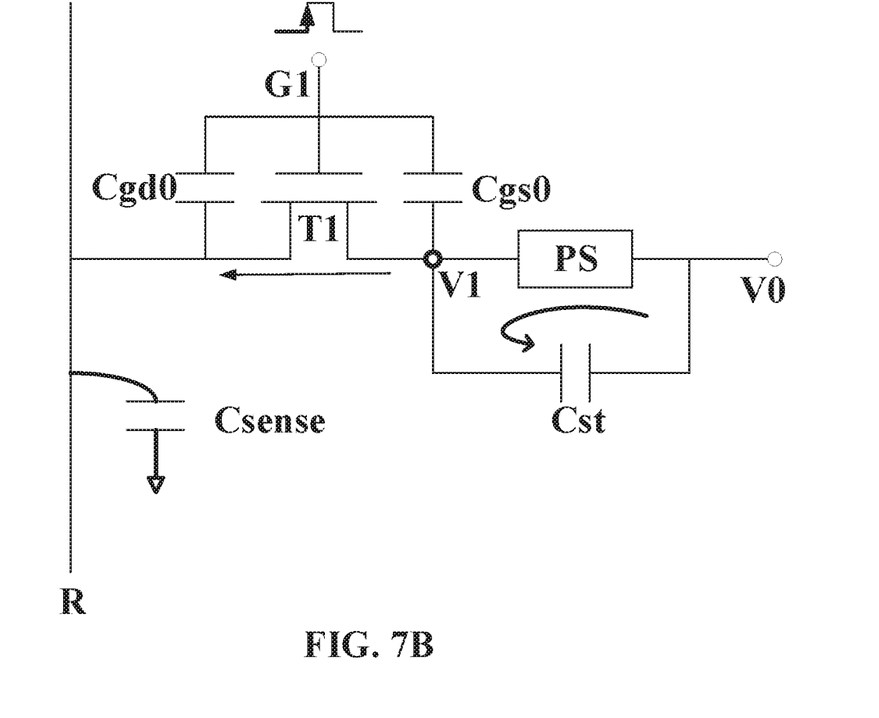
FIG. 7B is a circuit diagram illustrating effects of parasitic capacitance on the photo-sensing signal.

FIG. 7B is a circuit diagram illustrating effects of parasitic capacitance on the photo-sensing signal. Referring to FIG. 7B, $C_{st}$ stands for a storage capacitance of the photosensor PS, $C_{gs0}$ stands for a gate-source capacitance at the first thin film transistors T1, and $C_{gd0}$ stands for a gate-drain capacitance at the first thin film transistors T1. By having a protection layer in the display substrate, the gate-source capacitance $C_{gs0}$ and the gate-drain capacitance $C_{gd0}$ increase.

When the first thin film transistor T1 is turned off, the photosensor PS is charging the storage capacitance $C_{st}$. The voltage level V1 can be expressed according to Equation (1):

$$V_1 = I_1 \cdot t / C_{st} \tag{1}$$

wherein $I_1$ stands for a photocurrent generated in the photosensor PS, and t stands for the time duration of the charging.

At the time point the first thin film transistor T1 is turned on, the voltage level at the first gate electrode G1 is elevated. Due to the capacitance coupling effect, this induces a voltage level change $\Delta V_1$ at V1. The voltage level change $\Delta V_1$ can be expressed according to Equation (2):

$$\Delta V_1 = \frac{C_{gs0}}{C_{gs0} + C_{st} + C_{PIN}} (V_{GH} - V_{GL}); \tag{2}$$

wherein $C_{st}$ stands for a storage capacitance of the photosensor PS, $C_{gs0}$ stands for a gate-source capacitance at the first thin film transistors T1, $C_{PIN}$ stands for the capacitance of the photosensor PS, $V_{G1}$ stands for a turn-on voltage at the first gate electrode G1 of the first thin film transistor T1, and $V_{GL}$ stands for a turn-off voltage at the first gate electrode G1 of the first thin film transistor T1.

After the first thin film transistor T1 is fully turned on, the voltage level V1 is substantially the same as the voltage level V2, see, e.g., Equation (3):

$$V_2 \approx V_1 \tag{3}$$

At the time point the first thin film transistor T1 is turned off, the voltage level V2 undergoes a change $\Delta V_2$ due to the capacitance coupling effect. The voltage level change $\Delta V_2$ can be expressed according to Equation (4):

$$\Delta V_2 = \frac{C_{gd0}}{C_{gd0} + C_{sense}} (V_{GH} - V_{GL}); \tag{4}$$

wherein $C_{gd0}$ stands for a gate-drain capacitance at the first thin film transistors T1, $C_{sense}$ stands for the capacitance of the respective one of the read lines R, $V_{GH}$ stands for a turn-on voltage at the first gate electrode G1 of the first thin film transistor T1, and $V_{GL}$ stands for a turn-off voltage at the first gate electrode G1 of the first thin film transistor T1.

Accordingly, it can be derived that a voltage change $\Delta V_3$ in the respective one of the plurality of read lines R, due to the capacitance coupling effect at the time point the first time transistor T1 is turned on and at the time point the first thin film transistor T1 is turned off, and the voltage change $\Delta V_3$ can be expressed according to Equation (5):

$$\Delta V_3 = \Delta V_1 - \Delta V_2 \tag{5}$$

In a same display substrate, the pixel structures and the pixel circuits thereof in each of the plurality of subpixel areas are substantially the same or equivalents to each other. Thus, the voltage change $\Delta V_1$ corresponding to each of the plurality of read lines is substantially the same, the voltage change $\Delta V_2$ corresponding to each of the plurality of read lines is substantially the same, and the voltage change $\Delta V_3$ corresponding to each of the plurality of read lines is also substantially the same. Accordingly, the voltage change $\Delta V_3$ can be calibrated in the compensation circuit, the effects of the voltage change $\Delta V_3$ on the photo-sensing signal is negligible.

In another aspect, the present disclosure provides a method of fabricating a display substrate. In some embodiments, the method includes forming a plurality of light emitting brightness value detectors on a base substrate. Optionally, forming each of the plurality of light emitting brightness value detectors includes forming a first thin film transistor on the base substrate; forming a protection layer on a side of the first thin film transistor away from the base substrate; and subsequent to forming the first thin film transistor and forming the protection layer, forming a photosensor electrically connected to the first thin film transistor and configured to detect a light emitting brightness value. Optionally, the protection layer and the first thin film transistor are formed so that an orthographic projection of the protection layer on the base substrate covers an orthographic projection of at least a channel part of the first thin film transistor on the base substrate. Optionally, the protection layer and the first thin film transistor are formed so that the orthographic projection of the protection layer on the base substrate at least partially overlaps with an orthographic projection of a first source electrode and a first drain electrode of the first thin film transistor on the base substrate.

In some embodiments, the method further includes forming a contact electrode connecting the photosensor and a first source electrode of the first thin film transistor. Optionally, the contact electrode is formed between the photosensor and the base substrate. Optionally, the contact electrode and the photosensor are formed so that an orthographic projection of the contact electrode on the base substrate covers an orthographic projection of the photosensor on the base substrate.

In some embodiments, the step of forming the first thin film transistor includes forming a first source electrode, and the first source electrode is formed between the photosensor and the base substrate. The first source electrode of the first thin film transistor and the photosensor are formed so that an orthographic projection of the first source electrode on the base substrate covers an orthographic projection of the photosensor on the base substrate.

In some embodiments, prior to forming the protection layer and subsequent to forming the first thin film transistor, the method further includes forming a passivation layer, the passivation layer formed between the protection layer and the first thin film transistor; forming a contact electrode connecting the photosensor and a first source electrode of the first thin film transistor; and forming a first via extending through the passivation layer. Optionally, the contact electrode is formed to be electrically connected to the first source electrode of the first thin film transistor through the first via.

In some embodiments, the protection layer is formed to be electrically connected to a gate electrode of the first thin film transistor. Optionally, the steps of forming the protection layer and forming the contact electrode includes forming a conductive material layer on a side of the passivation layer away from the base substrate; and patterning the conductive material layer using a same mask plate, thereby forming the protection layer and the contact electrode in a single patterning step. The protection layer and the contact electrode are formed to be spaced apart from each other on the passivation layer.

In some embodiments, the method further includes forming a second via extending through the passivation layer. Optionally, the protection layer is formed to be electrically connected to a gate electrode of the first thin film transistor through the second via.

In some embodiments, the method further includes forming an insulating layer on a side of the photosensor and the protection layer away from the base substrate. Subsequent to forming the photosensor and prior to forming the insulating layer, the method is absent of an etching step. For example, after the photosensor is formed and before forming the insulating layer, there is no etching step of any components in the display substrate. By having this design, any inadvertent damage to the photosensor during the etching step of other components can be completely avoided.

In some embodiments, forming the photosensor includes a hydrogen bombardment treatment process. Thus, by having a protection layer that covers the channel part of the first active layer of the first thin film transistor, adverse effects (e.g., a negative shift of the threshold voltage) on the performance of the thin film transistor due to the hydrogen bombardment treatment can be avoided. Optionally, a combination of the protection layer and the first source electrode effectively protects the entire active layer of the first thin film transistor from the hydrogen bombardment treatment. Optionally, a combination of the protection layer and the contact electrode protects the entire active layer from the hydrogen bombardment treatment except for the gap between the protection layer and the contact electrode. Optionally, the protection layer alone is sufficient to protect the first active layer from the hydrogen bombardment treatment. e.g., the protection layer is formed so that the orthographic projection of the protection layer on the base substrate substantially covers the orthographic projection of the first active layer of the first thin film transistor on the base substrate.

In some embodiments, the display substrate is formed as a counter substrate. Optionally, the method further includes forming a color filter on the base substrate.

In some embodiments, the display substrate is formed as an array substrate having a plurality of subpixel areas. Optionally, the plurality of light emitting brightness value detectors are respectively formed in the plurality of subpixel areas. Optionally, the display substrate in each of the plurality of subpixel areas is formed to include a light emitting element; and a second thin film transistor configured to driving light emission of the light emitting element.

In some embodiments, the method further includes forming a plurality of read lines for respectively transmitting signals detected by the plurality of light emitting brightness value detectors. Optionally, the method further includes forming a compensation circuit connected to the plurality of read lines, and configured to adjust light emitting brightness values of the plurality of subpixel areas to the target brightness values.

In some embodiments, the method further includes forming a common electrode configured to be provided with a common voltage signal. Optionally, the photosensor is formed to include a first polarity region connected to the common electrode, a second polarity region connected to a source electrode of the first thin film transistor, and a diode junction connecting the first polarity region and the second polarity region. Optionally, the first thin film transistor is formed to include a source electrode connected to a second polarity region of the photosensor, and a drain electrode connected to a respective one of the plurality of read lines configured to transmit signals detected by the plurality of light emitting brightness value detectors. Optionally, the method further includes forming a common electrode signal line electrically connected to the common electrode for providing the common voltage signal to the common electrode.

Figure 8A:
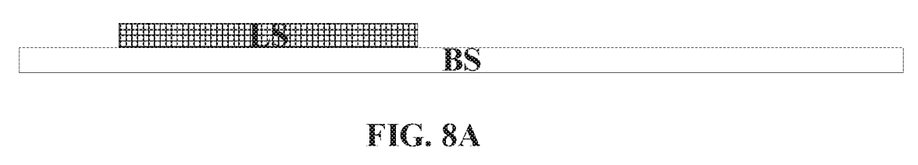
FIG. 8A to 8I illustrate a method of fabricating a display substrate in some embodiments according to the present disclosure.

FIG. 8A to 8I illustrate a method of fabricating a display substrate in some embodiments according to the present disclosure. Referring to FIG. 8A, a light shielding layer LS is formed on the base substrate BS. Various appropriate materials and various appropriate fabricating methods may be used for making the light shielding layer LS. For example, a light shielding material may be deposited on the substrate by vapor deposition (e.g., plasma-enhanced chemical vapor deposition), magnetron sputtering, or vacuum deposition. Examples of appropriate light shielding materials include, but are not limited to, metals, alloys, black materials such as a carbon material, and so on.

Figure 8B:
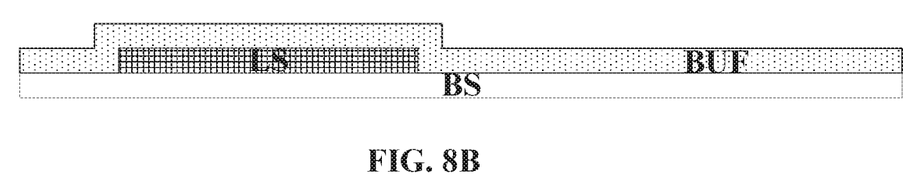

Referring to FIG. 8B, a buffer layer BUF is formed on a side of the light shielding layer LS away from the base substrate BS. Various appropriate insulating materials and various appropriate fabricating methods may be used to make the buffer layer BUF. For example, an insulating material may be deposited on the substrate by a plasma-enhanced chemical vapor deposition (PECVD) process and patterned. Examples of appropriate insulating materials for making the buffer layer BUF include, but are not limited to, silicon oxide ($SiO_x$), silicon nitride ($SiN_y$, e.g., $Si_3N_4$), silicon oxynitride ($SiO_xN_y$).

Figure 8C:
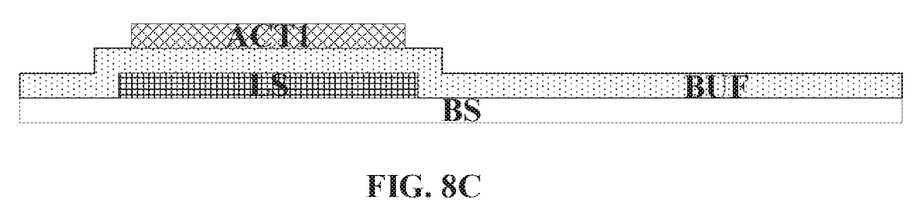
Figure 8D:
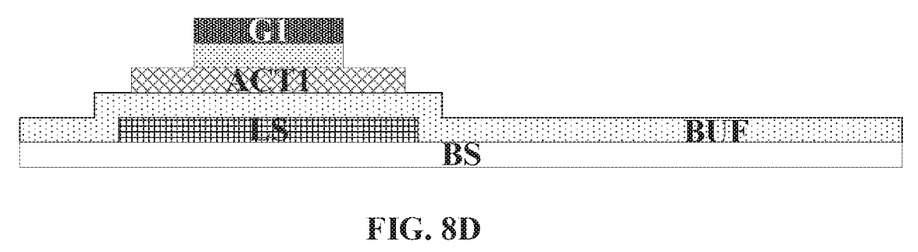

Referring to FIG. 8C and FIG. 8D, a first active layer ACT1 and a first gate electrode G1 are formed on a side of the buffer layer BUF away from the base substrate BS. Various appropriate semiconductor materials and various appropriate fabricating methods may be used to make the first active layer ACT1. For example, a semiconductor material may be deposited on the substrate by vapor deposition (e.g., plasma-enhanced chemical vapor deposition), magnetron sputtering, or vacuum deposition. Examples of appropriate semiconductor materials for making the first active layer ACT1 include, but are not limited to, amorphous silicon, polycrystalline silicon, metal oxides such as indium tin oxide and indium gallium tin oxide. Optionally, the first active layer ACT1 is made of a metal oxide.

Figure 8E:
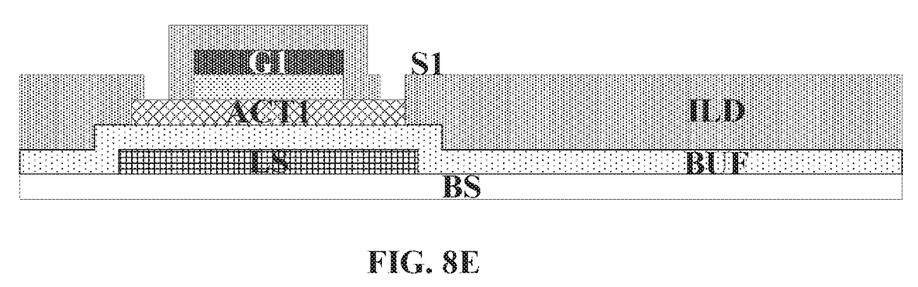
Figure 8F:
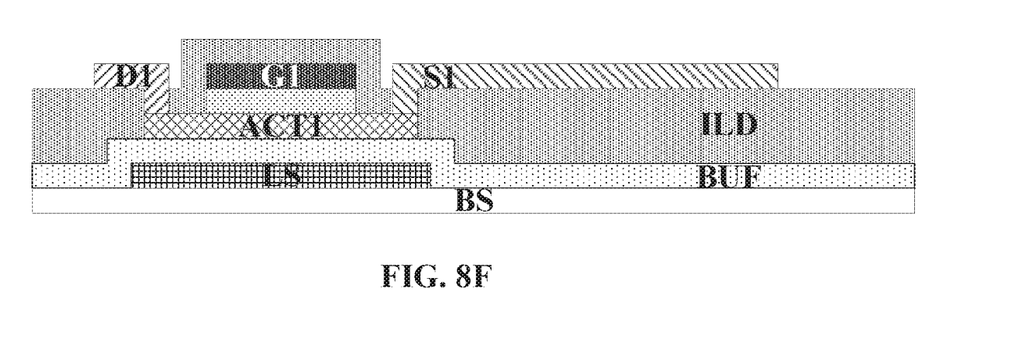

Referring to FIG. 8E, an inter-layer dielectric layer ILD is formed on a side of the first gate electrode G1 away from the base substrate BS. Referring to FIG. 8F, a first source electrode S1 and a first drain electrode D1 are formed on a side of the inter-layer dielectric layer ILD away from the base substrate BS. The first source electrode S1 and the first drain electrode D1 are respectively connected to the first active layer ACT1 through vias extending through the inter-layer dielectric layer ILD. Various appropriate electrode materials and various appropriate fabricating methods may be used to make the first gate electrode G1, the first source electrode S, and the first drain electrode D1. For example, an electrode material may be deposited on the substrate by vapor deposition (e.g., plasma-enhanced chemical vapor deposition), magnetron sputtering, or vacuum deposition. Examples of appropriate electrode materials for making the first gate electrode G1, the first source electrode S1, and the first drain electrode D1 include, but are not limited to, titanium, tantalum, aluminum, copper, molybdenum, chromium, and various alloys or laminates thereof.

Figure 8G:
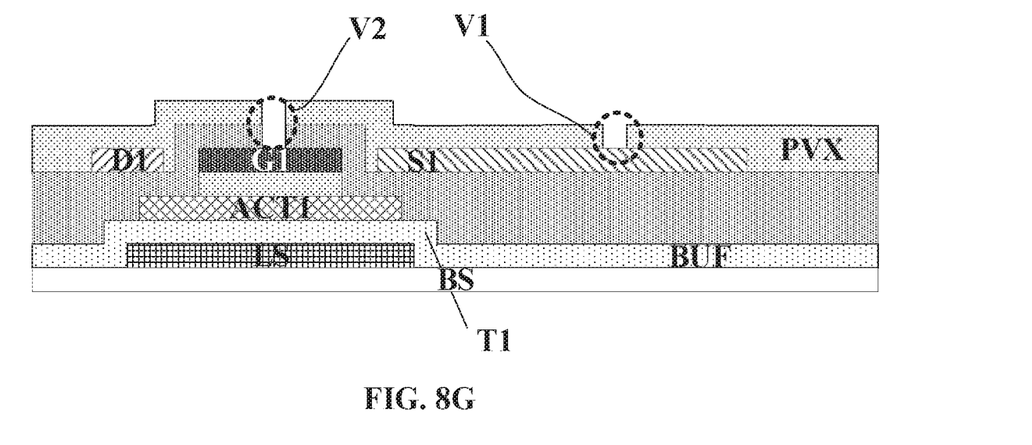

Referring to FIG. 8G, a passivation layer PVX is formed on a side of the first source electrode S, the first drain electrode D1, and the inter-layer dielectric layer ILD away from the base substrate BS. A first via V1 is formed to extend through the passivation layer PVX, exposing a portion of the first source electrode S1 underneath. A second via V2 is formed to extend through the passivation layer PVX and the inter-layer dielectric layer ILD, exposing a portion of the first gate electrode G1 underneath. Various appropriate insulating materials and various appropriate fabricating methods may be used to make the inter-layer dielectric layer ILD and the passivation layer PVX. For example, an insulating material may be deposited on the substrate by a plasma-enhanced chemical vapor deposition (PECVD) process and patterned. Examples of appropriate insulating materials for making the inter-layer dielectric layer ILD and the passivation layer PVX include, but are not limited to, polyimide, resins, silicon oxide ($SiO_x$), silicon nitride ($SiN_y$, e.g., $Si_3N_4$), silicon oxynitride ($SiO_xN_y$).

Figure 8H:
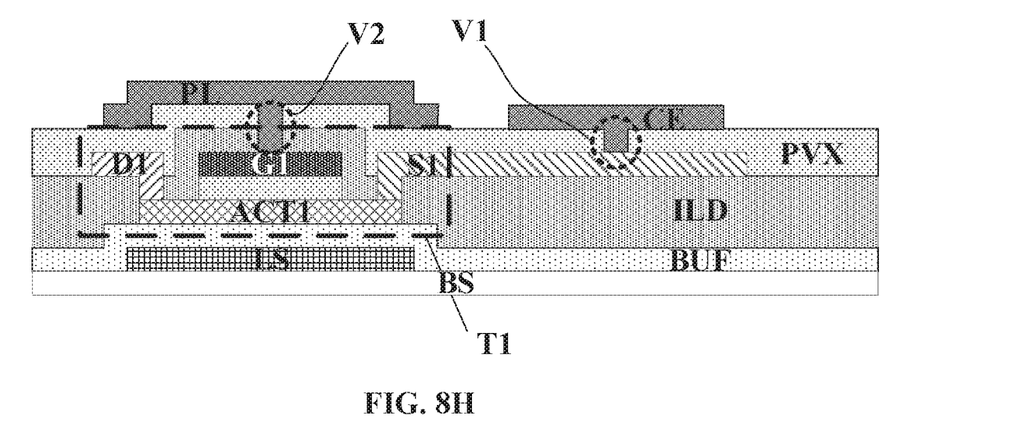

Referring to FIG. 8H, a protection layer PL and a contact electrode CE are formed on a side of the passivation layer PVX away from the base substrate BS. The protection layer PL and the contact electrode CE can be formed by forming a conductive material layer on a side of the passivation layer away from the base substrate; and patterning the conductive material layer using a same mask plate, thereby forming the protection layer PL and the contact electrode CE in a single patterning step. The protection layer PL and the contact electrode CE are formed to be spaced apart from each other on the passivation layer PVX. The protection layer PL is formed to be electrically connected to the first gate electrode G1 through the second via V2. The contact electrode CE is formed to be electrically connected to the first source electrode S1 through the first via V1. Various appropriate electrode materials and various appropriate fabricating methods may be used to make the protection layer PL and the contact electrode CE. For example, an electrode material (e.g., a metallic electrode material) may be deposited on the substrate by vapor deposition (e.g., plasma-enhanced chemical vapor deposition), magnetron sputtering, or vacuum deposition. Examples of appropriate electrode materials for making the protection layer PL and the contact electrode CE include, but are not limited to, titanium, tantalum, aluminum, copper, molybdenum, chromium, and various alloys or laminates thereof. Optionally, each of the protection layer PL and the contact electrode CE is formed to have a single-layer structure. Optionally, each of the protection layer PL and the contact electrode CE is formed to have two or more sub-layers.

Figure 8I:
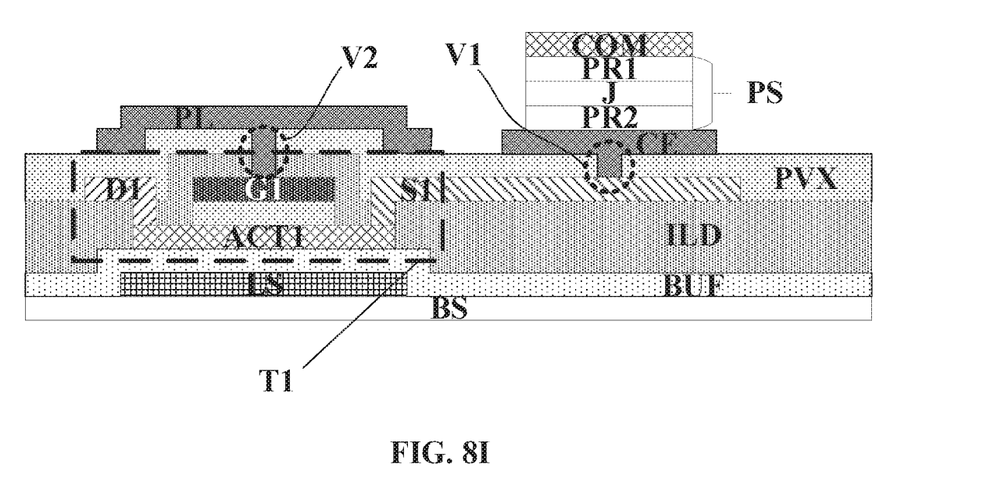

Referring to FIG. 8I, a photosensor PS is formed on a side of the contact electrode CE away from the base substrate BS, and a common electrode COM is formed on a side of the photosensor PS away from the base substrate BS. The photosensor PS is formed to include a first polarity region PR1 connected to the common electrode COM, a second polarity region PR2 connected to a first source electrode S1 of the first thin film transistors T1, and a diode junction J connecting the first polarity region PR1 and the second polarity region PR2. Various appropriate electrode materials and various appropriate fabricating methods may be used to make the common electrode COM. For example, an electrode material may be deposited on the substrate by vapor deposition (e.g., plasma-enhanced chemical vapor deposition), magnetron sputtering, or vacuum deposition. Examples of appropriate electrode materials for making the common electrode COM include, but are not limited to, transparent metal oxides such as indium tin oxide and indium zinc oxide.

In another aspect, the present disclosure provides a display panel including a display substrate described herein or fabricated by a method described herein. In some embodiments, the display panel is an organic light emitting diode display panel. In some embodiments, the display panel is a quantum dots light emitting diode display panel. In some embodiments, the display panel is a micro light emitting diode display panel.

In another aspect, the present disclosure provides a display apparatus including a display panel described herein. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display substrate, comprising:
a base substrate; and
a plurality of light emitting brightness value detectors on the base substrate;
wherein each of the plurality of light emitting brightness value detectors comprises:
a first thin film transistor;
a protection layer on a side of the first thin film transistor away from the base substrate; and
a photosensor electrically connected to the first thin film transistor and configured to detect a light emitting brightness value;
wherein an orthographic projection of the protection layer on the base substrate covers an orthographic projection of at least a channel part of the first thin film transistor on the base substrate; and
the protection layer is made of a conductive material.

2. The display substrate of claim 1, wherein the orthographic projection of the protection layer on the base substrate at least partially overlaps with an orthographic projection of a source electrode and a drain electrode of the first thin film transistor on the base substrate.

3. The display substrate of claim 1, further comprising a contact electrode connecting the photosensor and a source electrode of the first thin film transistor;
wherein the contact electrode is between the photosensor and the base substrate; and
an orthographic projection of the contact electrode on the base substrate covers an orthographic projection of the photosensor on the base substrate.

4. The display substrate of claim 1, wherein the first thin film transistor comprises a source electrode between the photosensor and the base substrate; and
an orthographic projection of the source electrode on the base substrate covers an orthographic projection of the photosensor on the base substrate.

5. The display substrate of claim 1, further comprising:
a passivation layer between the protection layer and the first thin film transistor;
a contact electrode connecting the photosensor and a source electrode of the first thin film transistor; and
a first via extending through the passivation layer;
wherein the contact electrode is electrically connected to the source electrode of the first thin film transistor through the first via.

6. The display substrate of claim 5, wherein the protection layer and the contact electrode are in a same layer and comprises a same conductive material; and
the protection layer and the contact electrode are spaced apart from each other on the passivation layer.

7. The display substrate of claim 5, further comprising a second via extending through the passivation layer;
wherein the protection layer is electrically connected to a gate electrode of the first thin film transistor through the second via.

8. The display substrate of claim 1, wherein the protection layer is electrically connected to a gate electrode of the first thin film transistor.

9. The display substrate of claim 1, wherein the display substrate has a plurality of subpixel areas;
wherein the plurality of light emitting brightness value detectors are respectively in the plurality of subpixel areas;
wherein the display substrate in each of the plurality of subpixel areas further comprises:
a light emitting element; and
a second thin film transistor configured to driving light emission of the light emitting element.

10. The display substrate of claim 9, further comprising:
a plurality of read lines for respectively transmitting signals detected by the plurality of light emitting brightness value detectors; and
a compensation circuit connected to the plurality of read lines, and configured to adjust light emitting brightness values of the plurality of subpixel areas to target brightness values.

11. The display substrate of claim 10, further comprising a common electrode configured to be provided with a common voltage signal;
wherein the photosensor comprises a first polarity region connected to the common electrode, a second polarity region connected to a source electrode of the first thin film transistor, and a diode junction connecting the first polarity region and the second polarity region; and
the first thin film transistor comprises a source electrode connected to a second polarity region of the photosensor, and a drain electrode connected to a respective one of the plurality of read lines configured to transmit signals detected by the plurality of light emitting brightness value detectors.

12. A display apparatus, comprising:
a base substrate; and
a plurality of light emitting brightness value detectors on the base substrate;
wherein each of the plurality of light emitting brightness value detectors comprises:
a first thin film transistor;
a protection layer on a side of the first thin film transistor away from the base substrate; and
a photosensor electrically connected to the first thin film transistor and configured to detect a light emitting brightness value;
wherein an orthographic projection of the protection layer on the base substrate covers an orthographic projection of at least a channel part of the first thin film transistor on the base substrate; and
the protection layer is made of a conductive material.

13. A method of fabricating a display substrate, comprising forming a plurality of light emitting brightness value detectors on a base substrate;
wherein forming each of the plurality of light emitting brightness value detectors comprises:
forming a first thin film transistor on the base substrate;
forming a protection layer on a side of the first thin film transistor away from the base substrate; and
subsequent to forming the first thin film transistor and forming the protection layer, forming a photosensor electrically connected to the first thin film transistor and configured to detect a light emitting brightness value;
wherein the protection layer and the first thin film transistor are formed so that an orthographic projection of the protection layer on the base substrate covers an orthographic projection of at least a channel part of the first thin film transistor on the base substrate; and the protection layer is made of a conductive material.

14. The method of claim 13, further comprising forming a contact electrode connecting the photosensor and a source electrode of the first thin film transistor;

wherein the contact electrode is formed between the photosensor and the base substrate; and the contact electrode and the photosensor are formed so that an orthographic projection of the contact electrode on the base substrate covers an orthographic projection of the photosensor on the base substrate.

15. The method of claim 13, prior to forming the protection layer and subsequent to forming the first thin film transistor, further comprising:

forming a passivation layer, the passivation layer formed between the protection layer and the first thin film transistor;

forming a contact electrode connecting the photosensor and a source electrode of the first thin film transistor; and forming a first via extending through the passivation layer;

wherein the contact electrode is formed to be electrically connected to the source electrode of the first thin film transistor through the first via.

16. The method of claim 15, wherein forming the protection layer and forming the contact electrode comprise:

forming a conductive material layer on a side of the passivation layer away from the base substrate; and patterning the conductive material layer using a same mask plate, thereby forming the protection layer and the contact electrode in a single patterning step;

wherein the protection layer and the contact electrode are formed to be spaced apart from each other on the passivation layer.

17. The method of claim 15, further comprising forming a second via extending through the passivation layer;

wherein the protection layer is formed to be electrically connected to a gate electrode of the first thin film transistor through the second via.

18. The method of claim 15, further comprising forming an insulating layer on a side of the photosensor and the protection layer away from the base substrate;

wherein subsequent to forming the photosensor and prior to forming the insulating layer, the method is absent of an etching step.

19. The method of claim 15, wherein forming the photosensor comprising a hydrogen bombardment treatment process.

* * * * *